(12) United States Patent
Hastings et al.

(10) Patent No.: US 6,954,108 B2
(45) Date of Patent: Oct. 11, 2005

(54) FAST-RESPONSE CURRENT LIMITING

(75) Inventors: Roy Alan Hastings, Allen, TX (US);
Lemuel Herbert Thompson, II, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/979,549

(22) Filed: Nov. 1, 2004

(65) Prior Publication Data

US 2005/0062542 A1 Mar. 24, 2005

Related U.S. Application Data

(62) Division of application No. 10/605,118, filed on Sep. 9, 2003, now Pat. No. 6,867,652.

(51) Int. Cl.[7] .................................................. H03F 3/04
(52) U.S. Cl. ........................................ 330/298; 330/252
(58) Field of Search ................................ 330/298, 252, 330/257, 261

(56) References Cited

U.S. PATENT DOCUMENTS

| | | | | |
|---|---|---|---|---|
| 6,538,513 B2 | * | 3/2003 | Godfrey et al. | 330/258 |
| 6,559,719 B2 | * | 5/2003 | Sakuragi | 330/252 |
| 6,741,130 B2 | * | 5/2004 | Wey et al. | 330/253 |

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

An amplifier (10″) has a first amplifier stage (14) for producing a control current ($I_x$) in response to an input voltage. A second amplifier stage (16) has first (46) and second (38) transistors. The first transistor (46) is coupled to receive the control current ($I_x$) and is operable to produce a control voltage. The second transistor (38) is coupled to receive the control voltage and operable to produce an output current. A nonlinear resistive element (50) is coupled to the first transistor (46) to add a nonlinear function of the control current ($I_x$) to the control voltage. The nonlinear resistive element (50) may include a third transistor connected between the first transistor (46) and a reference potential, operable to receive the control current ($I_x$) and to generate the nonlinear function thereof.

5 Claims, 2 Drawing Sheets

FAST-RESPONSE CURRENT LIMITING

This application claims priority and is a division under 35 USC §120 of application Ser. No. 10/605,118, filed Sep. 9, 2003 now U.S. Pat. No. 6,867,652. This application is a divisional of the above mentioned application. This invention relates to improvementws in electrical circuits, and more particularly to circuits and methods for fast response current limiting.

BACKGROUND OF INVENTION

1. Field of Invention

This invention relates to improvements in electrical circuits, and more particularly to circuits and methods for fast response current limiting.

2. Relevant Background

A prior-art two-stage amplifier 10 is shown in FIG. 1 for driving an output circuit 12, having a load, $R_L$, 18 and an nMOS output power transistor, $M_{POWER}$, 20. The circuit 10 may be, for example, an integrated circuit, with the circuit 12 provided either as a part thereof, or externally connected thereto.

The amplifier 10 has two stages 14 and 16. The first amplifier stage 14 has two PNP transistors $Q_1$, 22, and $Q_2$, 24, which have an emitter area ratio of 1X/NX. The transistors 22 and 24 have respective associated nMOS current mirror transistors $M_2$, 26, and $M_3$, 28. The transistors 26 and 28 mirror the current in nMOS transistor $M_1$, 30, which is connected to current source 32 that provides a current $I_B$ thereto. If the nMOS transistors 26 and 28 are designed to conduct equal currents, an input-referred voltage offset $V_{PTAT}$ will occur between the PNP transistors 22 and 24 due to their size differences and resulting different current densities therein. Assuming transistors 22 and 24 operate in low-level injection, the magnitude of the voltage offset equals $$V_{PTAT} = V_T \ln(N) \qquad [1]$$

where $V_T$ is the thermal voltage ($V_T = kT/q$, where k is Boltzmann's constant, T is the absolute temperature, and q is the charge on the electron), and where N is the emitter ratio as described above).

Since the circuit 10 is preferably fabricated as a single integrated circuit, the resistor $R_{AI}$ across which the input voltage is developed is preferably constructed of aluminum metallization, which has a temperature coefficient of about 3000 ppm/°C. The temperature coefficient of the resistor then matches (at least approximately) the temperature coefficient of the voltage $V_{PTAT}$. Therefore the current limit $I_{lim}$ generated by circuit 10 is largely independent of temperature. This current limit equals $$I_{lim} = \frac{V_T \ln(N)}{R_{AI}} \qquad [2]$$

In response to the input voltage across $R_{AI}$, the first amplifier stage 14 generates a current $I_X$ that is sunk into MOS transistor $M_4$ of the second amplifier stage 16. The magnitude of current $I_X$ equals:

$$I_X = I_S \exp\left(\frac{V_{IN} - V_{PTAT}}{V_T}\right) \qquad [3]$$

where $I_S$ is the saturation current of $Q_1$, and $V_{IN}$ equals the differential voltage appearing across resistor $R_{AI}$. The current $I_X$ is referred to herein as a "control current".

The second amplifier stage 16 includes a first nMOS transistor $M_4$, 46, connected to receive the control current $I_X$, and a second nMOS transistor $M_5$, 38, connected to a current source 40, which provides a current $I_{CP}$.

The first transistor 46 amplifies the control current $I_X$ to develop a control voltage, which is applied to the gate of the second transistor 38. The second transistor 38 generates an output current, which, in the embodiment illustrated controls the voltage at the gate of the output power transistor 20.

The frequency response of the amplifier of circuit 10 has two important poles. The first is an internal pole caused by capacitance $C_X$ acting against the resistance at node 36. The second is a gate pole caused by the capacitance $C_g$ acting against the resistance at node 43. In order to maintain adequate stability, the gain of the circuit must drop below unity before the phase margin drops below about 30°. This requires either that one of the poles be pushed back to a very low frequency (dominant-pole compensation) or that the gain of the circuit be artificially reduced.

Dominant-pole compensation is greatly complicated by the movement of the gate pole due to variations in effective gate capacitance $C_g$ with load resistance $R_L$. If $R_L$ is shorted, then $C_g$ includes a large contribution from the gate-to-source capacitance $C_{gs}$ of the output power transistor 20. Larger values of $R_L$ decrease the contribution of $C_{gs}$ to $C_g$. Dominant-pole compensation can still be achieved either by adding a large capacitance to node 43, or by connecting a Miller capacitance around transistor 38, but both solutions have the undesirable property of slowing the transient response of the amplifier.

The addition of transistor 46 greatly reduces the resistance at node 36. This has two beneficial effects. First, it reduces the loop gain, and second, it pushes the internal pole out to a higher frequency, effectively forcing the gate pole to become the dominant pole of the system. The addition of transistor 46 therefore compensates the amplifier without requiring the addition of any extraneous capacitance. The offset introduced by current $I_X$ can be compensated by drawing an equal current from node 45.

The circuit of FIG. 1 responds relatively rapidly to large input signals, such as those generated by hot-shorting the load $R_L$. The current available to slew the gate capacitance is the current in transistor 38, which equals $$I_{M5} = \frac{(W/L)_5}{(W/L)_4} I_X \qquad [4]$$

where $(W/L)_5$ and $(W/L)_4$ are respectively the width to length ratios of the nMOS transistors $M_5$, 38, and $M_4$, 46. As equation [3] indicates, this current is exponentially dependent upon the magnitude of the input voltage. This equation does not consider the terminal resistances of transistors 22 and 24, nor their finite betas. These factors will ultimately limit the current $I_X$, and through it, the response time of circuit 10.

SUMMARY OF INVENTION

In light of the above, the invention, in accordance with a broad aspect thereof, presents an amplifier. The amplifier has a first amplifier stage for producing a control current in response to an input voltage. A second amplifier stage has first and second transistors. The first transistor is coupled to receive the control current and is operable to produce a control voltage. The second transistor is coupled to receive the control voltage and is operable to produce an output current. A nonlinear resistive element is coupled to the first transistor to add a nonlinear function of the control current to the control voltage. In one embodiment, the nonlinear resistive includes a third transistor connected between the first transistor and a reference potential, the third transistor operable to receive the control current and to generate the nonlinear function of the control current.

In accordance with another broad aspect of the invention, a circuit is presented that has an amplifier for producing a control current in response to an input voltage and a control voltage in response to the control current. A circuit is provided for producing an output current in response to the control voltage. A nonlinear resistive element is also provided for adding voltage that is a nonlinear function of the control current to the control voltage. An output stage is driven in response to the output current.

In accordance with still another broad aspect of the invention, a method is presented for controlling an output current of a circuit. The method includes producing a control current in response to an input voltage and a control voltage in response to the control current, producing an output current in response to the control voltage, providing a nonlinear resistive element for adding voltage that is a nonlinear function of the control current to the control voltage, and driving an output stage in response to the output current.

BRIEF DESCRIPTION OF DRAWINGS

In the various figures of the drawing, like reference numerals are used to denote like or similar parts.

DETAILED DESCRIPTION

Figure 2:
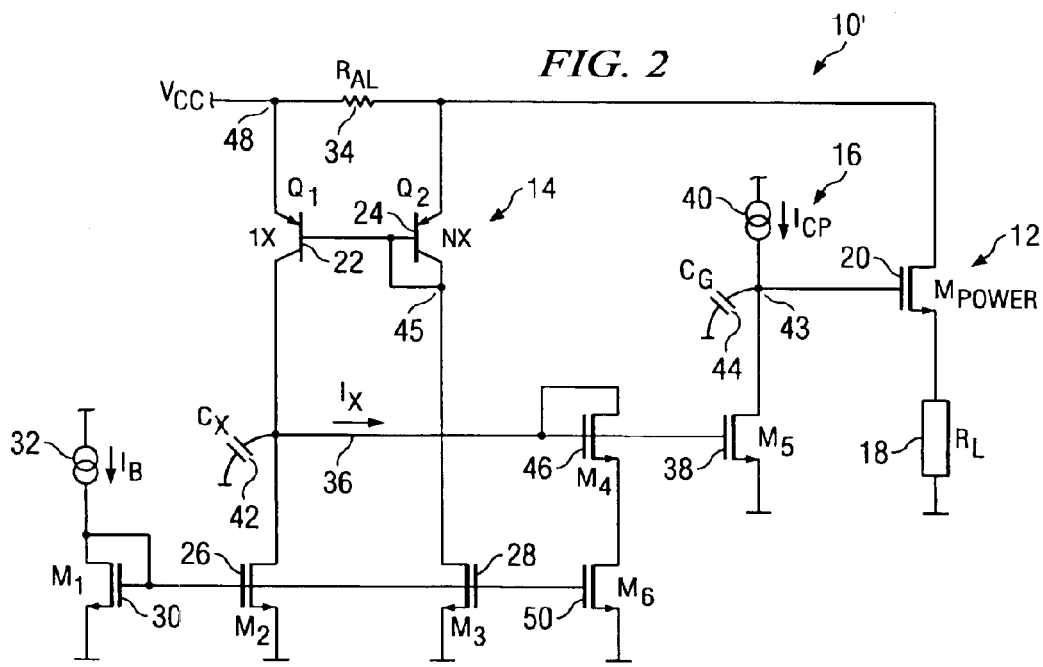
FIG. 2 is a two-stage amplifier circuit showing an example of an incorporation therewith of a nonlinear resistive element, according to a preferred embodiment of the invention.

With reference now additionally to the circuit 10' of FIG. 2, a third nMOS transistor $M_6$, 50, is shown connected between the source of the first nMOS transistor 46 and ground. The third transistor 50 may be an nMOS device, as in the embodiment shown. Those skilled in the art will recognize that the circuit 10' may be constructed with transistors of different types, (i.e., lateral, vertical, bipolar, MOSFET, and on) and conductivities (i.e., PNP, NPN, nMOS, PMOS, and so on), and that other circuit components (not shown) for collateral purposes may also be employed within the circuit 10'.

First transistor 46, although necessary in order to ensure stability, slows the transient response of circuit 10'. The first transistor 46 draws off current that could otherwise transiently charge capacitance 42. Furthermore, since the current provided by PNP transistor 22 is limited by beta and terminal resistances, the first transistor 46 effectively clamps the voltage swing seen at the node 36, and thus limits the maximum current that the second transistor 38 can sink. The slower transient performance increases the time required to turn off the output transistor 20 in the event of a severe overcurrent condition, such as a short circuit. However, these and other issues are addressed by the addition of the third transistor 50.

The third transistor 50 is sized to provide a much smaller drain-to-source resistance than the first transistor 46 when the circuit 10' operates at or near equilibrium ($V_{IN} \approx V_{PTAT}$). In the embodiment shown, this entails sizing the third transistor 50 so that it operates in the triode (or linear) region when the circuit is at or near equilibrium, and further constructing the third transistor 50 to have a much larger width-to-length ratio than the first transistor 46.

The drain-to-source resistance of the third transistor 50 will dramatically increase when the current flowing through it exceeds a threshold value. In the embodiment shown, this increase in resistance corresponds to the transition from the triode region to the saturation region. Thus, the third transistor 50 is sized so that this transition occurs only when the circuit is perturbed from its equilibrium condition ($V_{IN} \gg V_{PTAT}$).

In or near equilibrium, the drain-to-source resistance of third transistor 50 is much smaller than that of the first transistor 46. Thus, circuit 10' operates essentially in the manner as the above-described circuit 10. However, if circuit 10' is perturbed from equilibrium, for example by a short-circuiting of the load resistance $R_L$, then the current $I_X$ will increase to the point that the third transistor 50 enters saturation. At this point, the current flow through the first transistor 46 is effectively choked off by the large drain-to-source resistance of the third transistor 50. Any increase in current $I_X$ above and beyond that required to saturate the third transistor 50 will then go to charge capacitance 42 and slew node 36. Furthermore, the voltage of node 36 will no longer be limited by the current that the PNP transistor 22 can deliver. Therefore circuit 10' will slew substantially faster than prior-art circuit 10.

When the third transistor 50 saturates, the pole created by parasitic capacitor 42 moves in to lower frequencies. If the circuit were operating at equilibrium, this would erode the phase margin and could potentially cause the circuit to become unstable. However, third transistor 50 only saturates when circuit 10' is far from equilibrium. As the circuit approaches equilibrium, the third transistor 50 drops back into triode mode, and the pole created by parasitic capacitor 42 moves out to higher frequencies. Therefore circuit 10' exhibits stable operation at equilibrium in combination with rapid slewing when far from equilibrium.

More generally, the third transistor 50 may be viewed as a nonlinear resistive element that adds a nonlinear function of the control current, $I_X$, to the control voltage that is generated by the first transistor 46. This nonlinear function is only weakly dependent upon the control current up to a certain threshold, beyond which the control voltage increases very rapidly as a function of the control current. This threshold is selected so as to lie well above the control current, $I_X$, expected to flow under equilibrium conditions. It should be understood that the third transistor 50 can be replaced with any circuit element that operates in a manner similar to that described above. This results in the advantages described above, and, more particularly, extends the use of the circuit of FIG. 1 to enable it to be used with discrete power transistors which operate at much larger voltages.

It should be emphasized that although the third transistor 50 is shown and described above in the context of a MOS device, and more particularly, and nMOS device, it may be a pMOS device, a bipolar transistor, or other appropriate device. If a bipolar transistor is used for the third transistor 50, it would be biased such that at or near equilibrium, the transistor would operate in a saturation mode, and away from equilibrium, the transistor would operate in a forward-active mode. The bipolar transistor also can be either a PNP or NPN device, depending upon the particular circuit construction employed.

It should be noted that the output power transistor 20, particularly if it is externally provided, should have a low on-resistance in order to prevent excessive conduction losses. However, during a hot-short event, this low on-resistance may allow extremely large currents to flow. The magnitude of these currents, coupled with the large voltages present across the transistor, can produce extreme levels of power dissipation, which in some cases may be in the kilowatt range. In such cases, the output power transistor 20 needs to be turned off very quickly, typically within a microsecond or two, in order to prevent its destruction. Moreover, a large external output power transistor may have a correspondingly large gate capacitance, which makes it even more difficult to turn off quickly. Thus, an amplifier circuit that can sink large currents and slew rapidly is of great practical significance for current limiting applications.

The addition of the third transistor 50 improves the slew rate response of the circuit 10' and (in most cases) increases the maximum current that the second transistor 38 can sink. However, the benefits of the third transistor 50 are limited by certain practicalities of circuit design, most notably the sizing requirements for transistor 38.

Figure 3:
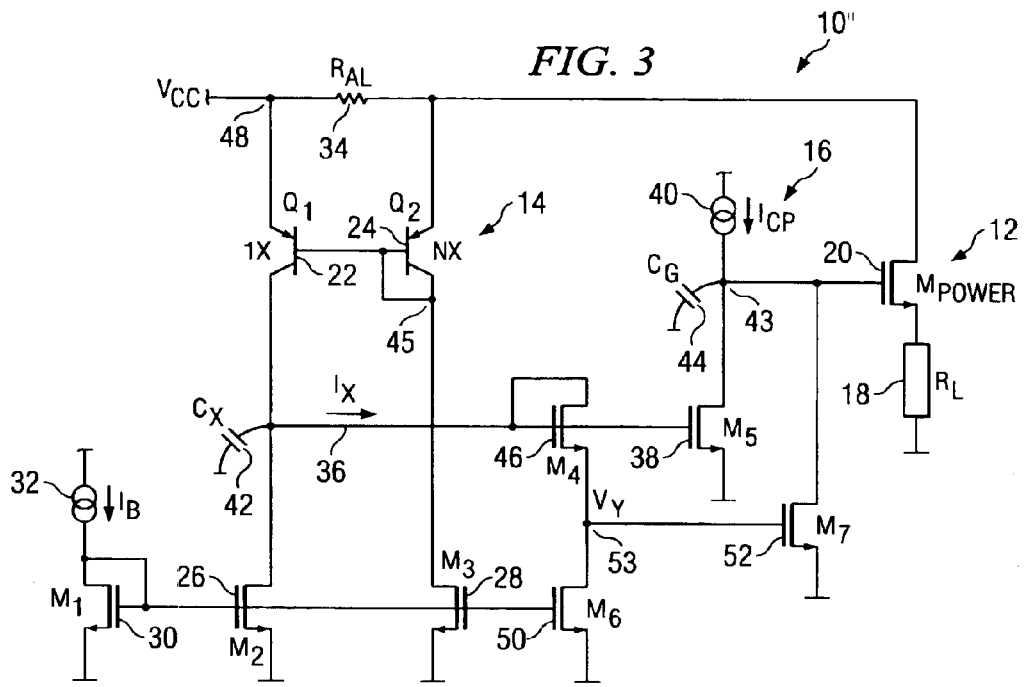
FIG. 3 is a two-stage amplifier circuit additionally showing circuitry for sinking additional currents, according to another preferred embodiment of the invention.

If additional sinking current is desired, additional circuitry may be added, as shown in the circuit 10" of FIG. 3, to which reference is now additionally made. Circuit 10" includes a booster circuit comprising a fourth nMOS transistor $M_7$, 52. Although an nMOS device is shown, those skilled in the art will appreciate that other types and conductivities of devices may be used, depending upon the particular construction of the circuit 10". The fourth transistor 52 may be a large device that can sink a correspondingly large current. When circuit 10" operates at or near equilibrium, the voltage developed across third transistor 50 is insufficient to bias the fourth transistor 52 into conduction. Furthermore, the large gate capacitance of the fourth transistor 52 is shunted to ground through the relatively low drain-to-source resistance of the third transistor 50, effectively suppressing any pole or zero that this gate capacitance might otherwise have generated. Therefore, while at or near equilibrium, circuit 10" acts in much the same way as circuit 10.

When the third transistor 50 is biased into saturation, the potential on node 53 rises, turning on the fourth transistor 52. The fourth transistor 52 provides additional sinking current to help pull the gate of the output power transistor 20 to ground. This action is in addition to the action of the second transistor 38 of the second amplifier stage 16, which also serves to pull down the gate of the output power transistor 20 to ground.

In the operation of the circuit 10", when the third transistor 50 saturates, current $I_X$ charges the gate capacitance of the fourth transistor 52. If the fourth transistor 52 is very large, its gate capacitance may slow the slew of the circuit, thereby slowing the overall response time. In such cases, the circuit embodiment 10''' of FIG. 4, to which reference is now additionally made, may be used. In the circuit 10''', the gate of the fourth transistor $M_7$, 52, is connected to a node $V_z$, 59, between fifth and sixth nMOS transistors $M_8$, 54, and $M_9$, 56, connected between the supply voltage 48 and ground. Fourth, fifth, and sixth transistors 52, 54 and 56 together form a booster circuit for the circuit embodiment 10'''.

The gate of the fifth transistor 54 is connected to the gate of the first transistor 38 of the second amplifier stage 16, and the gate of the sixth transistor 56 is connected to the gate of the third transistor 50. The drain of the fifth transistor 54 is connected to the supply voltage 48, and the sixth transistor 56 is connected between the source of the fifth transistor 54 and ground. In the embodiment shown, transistors 54 and 56 may be nMOS devices, as shown; however, as above, it will be appreciated by those skilled in the art, other types and conductivities of devices may be used, depending upon the particular construction of the circuit 10'''.

In the circuit 10''', the fifth transistor 54 acts as a source follower, which is biased into conduction by the sixth transistor 56. The insertion of a source follower provides a much larger current to charge the gate capacitance of the fourth transistor 52, without greatly increasing the capacitance seen at node 36. What capacitance is seen at node 36 can be minimized by making the fifth transistor 54 relatively wide and narrow, thus maximizing its transconductance for a given gate capacitance. This is allowable since the fifth transistor 54 does not need to accurately match any other transistor in the circuit.

Circuits 10', 10" and 10''' represent a progressive development of a single concept. All three circuits contain a nonlinear resistive element (50) that allows a rapid increase in the control voltage (at node 36) when the circuit is driven from equilibrium. All three circuits achieve a faster rate of slew on the inter-stage node (node 36) through use of the nonlinear resistive element, and all three achieve higher second-stage sink currents, although they differ in their means towards this end. Circuit 10' relies merely upon a high voltage at node 36 fully enhancing transistor 38. Circuit 10" supplements transistor 38 with a booster circuit that includes a transistor 52 which conducts only after the nonlinear resistive element has transitioned from its low-resistance region to its high-resistance region. Circuit 10''' uses a booster circuit that includes a source follower stage comprising transistors 54 and 56 to enable a much larger output sink device (transistor 52) without excessive increase of the capacitance on node 36.

Figure 1:
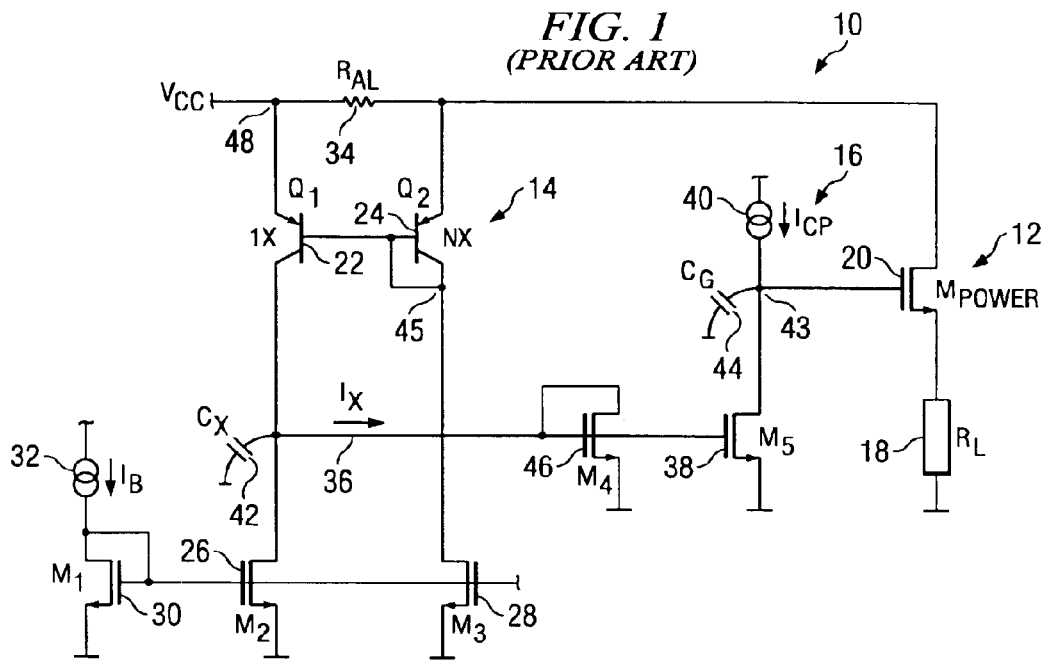
FIG. 1 is a two-stage amplifier circuit, according to the prior art.
Figure 4:
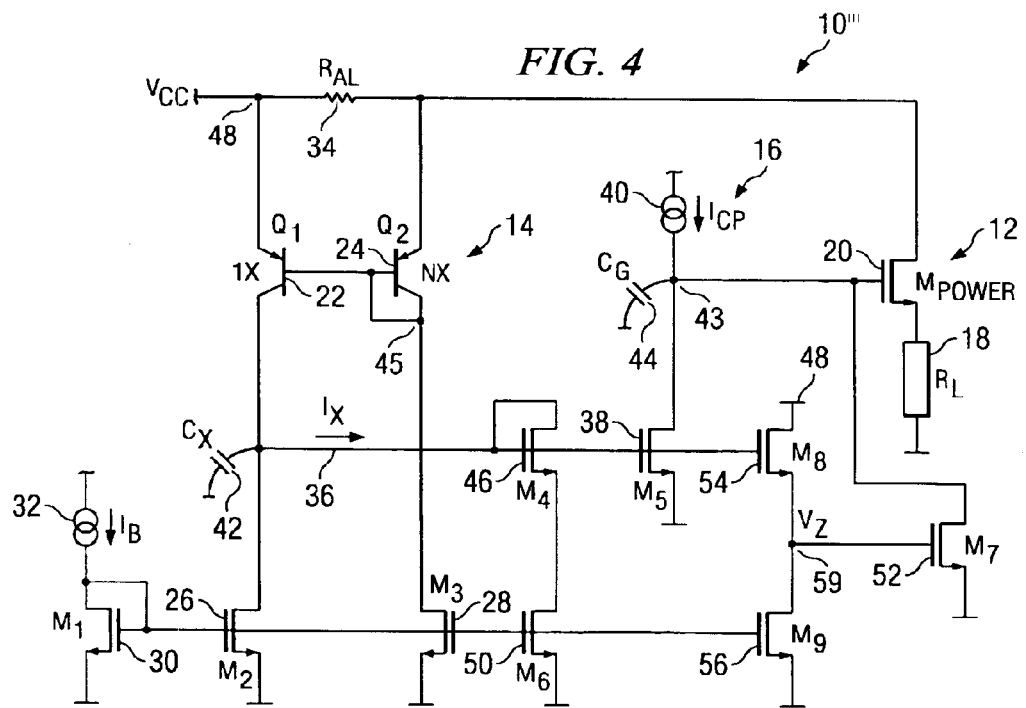
FIG. 4 is a two-stage amplifier circuit further showing circuitry for reducing capacitive effects of at least some circuit elements, according to still another preferred embodiment of the invention.

It should be noted that although the circuits of FIGS. 2, 3, and 4 are shown in the context of the transconductance and load circuits 14 and 12 of FIG. 1, the transconductance and load circuits shown are examples only, and that various other circuits and circuit arrangements may be used in place thereof within the scope of the invention. Moreover, other permutations may be used; as suggested above, for example, the circuits may be easily implemented entirely in bipolar devices or entirely in MOS devices. Another easily implemented permutation may be the inversion of the power supply, wherein a negative power supply may be used referenced to ground or to a positive potential, with appropriate polarity changes of the devices of the circuit.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:
1. A circuit, comprising:
   an amplifier for producing a control current in response to an input voltage and a control voltage in response to said control current;

a circuit for producing an output current in response to said control voltage;

a nonlinear resistive element for adding a voltage that is a nonlinear function of said control current to said control voltage;

and an output stage driven in response to said output current.

2. The circuit of claim 1 wherein said nonlinear resistive element is a MOS transistor constructed to operate in triode mode when said control current is below a predetermined level and in saturation mode when said control current is above said predetermined level.

3. The circuit of claim 1 wherein said nonlinear resistive element is a bipolar transistor constructed to operate in saturation mode when said control current is below a predetermined level and in forward active mode when said control current is above said predetermined level.

4. The circuit of claim 1 further comprising a circuit that is connected in parallel with said circuit for producing an output current when said control current exceeds a predetermined value.

5. The circuit of claim 4 further comprising a circuit connected to isolate a capacitance of said circuit that is connected in parallel with said circuit for producing an output current.

* * * * *

UNITED STATES PATENT AND TRADEMARK OFFICE
CERTIFICATE OF CORRECTION

| | |
|---|---|
| PATENT NO. | : 6,954,108 B2 |
| DATED | : October 11, 2005 |
| INVENTOR(S) | : Roy Alan Hastings and Lemuel H. Thompson, II |

It is certified that error appears in the above-identified patent and that said Letters Patent is hereby corrected as shown below:

Title page,
Item [62], Related U.S. Application Data, should read as follows:
-- Division of application No. 10/605,118, filed September 9, 2003, now Patent No. 6,867,652 previously filed as provisional application No. 60/426,175, filed November 14, 2002. --.

Signed and Sealed this

Twenty-fourth Day of January, 2006

JON W. DUDAS
*Director of the United States Patent and Trademark Office*